United States Patent
Berg-Palmqvist et al.

(10) Patent No.: US 12,003,184 B2
(45) Date of Patent: Jun. 4, 2024

(54) POWER CONVERTER ASSEMBLY AND A POWER SYSTEM

(71) Applicant: Volvo Construction Equipment AB, Eskilstuna (SE)

(72) Inventors: Anders Berg-Palmqvist, Eskilstuna (SE); Arto Honkanen, Eskilstuna (SE); Carl Fredrik Wangenborn, Eskilstuna (SE); Alexander Svensson, Eskilstuna (SE)

(73) Assignee: Volvo Construction Equipment AB, Eskilstuna (SE)

( * ) Notice: Subject to any disclaimer, the term of this patent is extended or adjusted under 35 U.S.C. 154(b) by 346 days.

(21) Appl. No.: 17/621,637

(22) PCT Filed: Jun. 24, 2019

(86) PCT No.: PCT/EP2019/066626
§ 371 (c)(1),
(2) Date: Dec. 21, 2021

(87) PCT Pub. No.: WO2020/259792
PCT Pub. Date: Dec. 30, 2020

(65) Prior Publication Data
US 2022/0360188 A1 Nov. 10, 2022

(51) Int. Cl.
*H02M 7/00* (2006.01)
*B60R 16/02* (2006.01)
(Continued)

(52) U.S. Cl.
CPC ............. *H02M 7/003* (2013.01); *B60R 16/02* (2013.01); *H02G 5/04* (2013.01);
(Continued)

(58) Field of Classification Search
CPC ........ H02M 7/003; H02M 3/003; H02M 1/00; H02M 1/0067; H05K 7/14329;
(Continued)

(56) References Cited

U.S. PATENT DOCUMENTS

| 7,057,311 B1 * | 6/2006 | Zhou | H01H 9/563 |
| | | | 307/131 |
| 2003/0037941 A1 | 2/2003 | Kim et al. | |

(Continued)

FOREIGN PATENT DOCUMENTS

| CN | 201821282 U | 5/2011 |
| CN | 103872972 A | 6/2014 |

(Continued)

OTHER PUBLICATIONS

International Search Report and Written Opinion of the International Searching Authority, PCT/EP2019/066626, dated Mar. 17, 2020, 13 pages.

(Continued)

*Primary Examiner* — Michael A Matey
(74) *Attorney, Agent, or Firm* — Sage Patent Group

(57) ABSTRACT

The invention relates to a power converter assembly including at least two power converter units; a busbar; at least two connecting elements, each connecting element electrically connecting one of said power converter units to the busbar, thereby interconnecting the at least two power converter units; and at least one converter housing, enclosing and shielding at least one of said power converter units. It further includes a busbar housing in which the busbar is contained and shielded, wherein the at least two connecting elements are electrically isolated from the busbar housing and from the at least one converter housing. The invention further relates to a working machine and a power system including said power converter assembly.

15 Claims, 6 Drawing Sheets

(51) Int. Cl.
  *H02G 5/04* (2006.01)
  *H05K 7/14* (2006.01)
  *H05K 7/20* (2006.01)

(52) U.S. Cl.
  CPC ....... *H05K 7/14329* (2022.08); *H05K 7/2089* (2013.01); *H05K 2201/10272* (2013.01)

(58) Field of Classification Search
  CPC ............... H05K 7/1432; H05K 7/2089; H05K 2201/10272; H05K 5/0247; Y02T 10/62; H01L 23/50; H02J 2207/20; H02B 1/20; H02G 5/04; B60R 16/02
  See application file for complete search history.

(56) References Cited

U.S. PATENT DOCUMENTS

| | | | |
|---|---|---|---|
| 2008/0231127 A1 | 9/2008 | Lacaze | |
| 2012/0224942 A1* | 9/2012 | Cherney | E02F 9/2087 903/902 |
| 2013/0058143 A1* | 3/2013 | Tachibana | H05K 7/14329 363/131 |
| 2014/0140119 A1* | 5/2014 | Shinohara | H05K 7/1432 363/141 |
| 2014/0198475 A1* | 7/2014 | Menzies | H01R 13/08 361/811 |
| 2015/0077964 A1* | 3/2015 | Lim | H05K 9/0007 361/818 |
| 2015/0173238 A1* | 6/2015 | Nakanishi | H05K 7/14329 29/830 |
| 2015/0223366 A1* | 8/2015 | Horiuchi | H05K 7/20254 361/689 |
| 2016/0226396 A1* | 8/2016 | Hattori | H02M 7/53871 |
| 2016/0373017 A1* | 12/2016 | Mima | H02M 7/2173 |
| 2017/0033593 A1* | 2/2017 | Kamizuma | H02M 5/45 |
| 2017/0214377 A1 | 7/2017 | Ridder et al. | |
| 2018/0116065 A1 | 4/2018 | Schuetz et al. | |
| 2018/0166995 A1 | 6/2018 | Friedlund et al. | |
| 2019/0115848 A1* | 4/2019 | Okazaki | H02M 7/48 |
| 2019/0270417 A1* | 9/2019 | Spesser | B60L 3/0007 |
| 2022/0045626 A1* | 2/2022 | Sano | H02M 7/003 |

FOREIGN PATENT DOCUMENTS

| | | |
|---|---|---|
| CN | 106601361 A | 4/2017 |
| CN | 207321126 U | 5/2018 |
| DE | 102016214878 A1 | 2/2018 |
| JP | 2001085886 A | 3/2001 |
| WO | 2015040970 A1 | 3/2015 |

OTHER PUBLICATIONS

First Office Action and Search Report for Chinese Patent Application No. 201980097760.X, dated May 31, 2023, 8 pages.

* cited by examiner

US 12,003,184 B2

POWER CONVERTER ASSEMBLY AND A POWER SYSTEM

CROSS REFERENCE TO RELATED APPLICATIONS

This application is a 35 U.S.C. § 371 national stage application of PCT International Application No. PCT/EP2019/066626 filed on Jun. 24, 2019, the disclosure and content of which is incorporated by reference herein in its entirety.

TECHNICAL FIELD

The invention relates to a power converter assembly and a power system comprising a power converter assembly. The invention also relates to a working machine and to a vehicle.

The power converter assembly and power system according to the invention are particularly applicable on working machines within the fields of industrial construction machines or construction equipment. Although the invention will be described with respect to a wheel loader, the invention is not restricted to this particular working machine, but may also be used in other working machines such as articulated haulers, excavators and backhoe loaders, but also in vehicles such as buses and trucks.

BACKGROUND

Electric power systems are extensively used in working machines and vehicles, providing power for driving traction motors for propulsion or for carrying out various operations. Such electric power systems may be pure electric drive system, including power sources in the form of e.g. batteries or fuel cells, or form part of a hybrid drive system, including a generator coupled to a combustion engine. In both cases, the electric power system needs to include a plurality of power converter units for converting power, e.g. for converting alternating current (AC) power input from a generator into direct current (DC) power, which is stored in a capacitor bank and filtered, and thereafter converted back into AC power output of desired frequency and voltage for driving a traction motor.

When integrating power converter units in electric power systems of working machines or vehicles, several aspects must be taken into account. For example, the available space is usually limited, and the environmental conditions may be challenging, with the components of the power system being subjected to e.g. moisture, dirt and chemicals. Furthermore, in particular in compact systems, problems originating from electromagnetic interference (EMI) may arise and degrade the performance of the electric power system itself or of nearby electronic systems.

US 2018/0166995 discloses an inverter assembly for an electric power system. The inverter assembly comprises a plurality of stackable housings in which inverter units are received to achieve a compact inverter assembly. The inverter units are interconnected by means of a busbar, providing low impedance and reducing power losses in the inverter assembly.

Definitions

Power converter units are herein understood to include devices for converting direct current (DC) to alternating current (AC), such as inverters, devices for converting AC to DC, such as rectifiers, devices for DC to DC conversion, and devices for AC to AC conversion, such as transformers. Examples of such devices used in working machines and vehicles are e.g. traction inverters, static converters, auxiliary converters, energy storage converters, generator converters, and static inverters.

The term electromagnetic interference (EMI) is herein understood to refer to electromagnetic emission and radiation including both electromagnetic interference (EMI) and radio-frequency interference (RFI). Both of these types of interference generate electromagnetic fields that can interfere with the operation of adjacent electrical equipment.

By galvanically connecting two or more parts is herein intended connecting said parts such that an electric current may flow between the connected parts, i.e. by means of a physical contact such as a metal to metal contact. Likewise, by galvanically connected is intended connected such that an electric current may flow between the connected parts.

A busbar is herein understood to be a rigid conductor, such as a metallic strip, plate or bar.

SUMMARY

A primary object of the invention is to provide a power converter assembly and a power system which are in at least some aspects improved with respect to previous solutions. In particular, it is an object to achieve a relatively compact power converter assembly for integration into an electric power system of a working machine or a vehicle, for which power converter assembly electromagnetic compatibility (EMC) is assured and by means of which problems arising as a result of e.g. electromagnetic interference (EMI) can consequently be minimized. It is also an object to achieve a power converter assembly having a low DC link inductance. Another object is to achieve a power converter assembly in which included components are efficiently protected from mechanical damage as well as from moisture, chemicals and dirt, and which is thereby well-suited for use in e.g. a working machine or a vehicle.

According to a first aspect of the invention, at least the primary object is achieved by a power converter assembly according to claim 1. The power converter assembly comprises:
  at least two power converter units;
  a busbar;
  at least two connecting elements, each connecting element galvanically connecting one of said power converter units to the busbar, thereby interconnecting the at least two power converter units; and
  at least one converter housing, wherein the at least one converter housing encloses and shields at least one of said power converter units.

The power converter assembly is characterized in that it further comprises a busbar housing in which the busbar is contained and shielded, wherein the at least two connecting elements are galvanically isolated from the busbar housing and from the at least one converter housing.

By providing separate housings for the busbar and the power converter units, a compact power converter assembly which complies with EMC requirements and which efficiently protects the power converter units and the busbar from EMI as well as from dirt, moisture and other pollutants may be achieved. The use of a busbar instead of e.g. cables or wires provides low impedance and also reduces DC link inductance in the power converter assembly.

In the proposed power converter assembly, the power converter unit and the busbar are shielded, i.e. electromagnetically shielded to avoid electromagnetic interference (EMI), by means of the respective housings, i.e. the at least one converter housing electromagnetically shields the power converter units and the busbar housing electromagnetically shields the busbar. Thus, the respective housings should be configured such as to provide an efficient barrier to EMI at relevant frequencies. The housings may e.g. be made of aluminium, steel or other metal material, or may be of plastic material coated with a conducting material or of a conducting plastic material. The converter housings may be stackable to facilitate the building of a compact power converter assembly.

The connecting elements reaches through the busbar housing and the converter housings such as to connect the power converter units to the busbar, but are galvanically isolated from the housings. A current may thereby flow between the power converter units via the busbar, but a current may never flow between the power converter units or the busbar on one hand and the busbar housing or the converter housings on the other hand. Preferably, for each power converter unit, two connecting elements are provided for connecting each of a DC+ and a DC– connection of the power converter unit to a positive and a negative power rail of the busbar, respectively.

Apertures in the respective housings, through which the connecting elements extend, are dimensioned such that escape or entrance of undesirable frequencies of electromagnetic radiation is prevented, thereby avoiding interference with the operation of electronic equipment adjacent to the power converter assembly. Generally, to prevent higher frequency components of electromagnetic waves emanating from electromagnetic fields generated by the power converter units from escaping on entering, relatively small aperture sizes are needed. The escape of such high frequency components may interfere with the operation of electronic equipment adjacent to the power converter assembly. It is well-known in the field how to appropriately size and shape apertures so as to prevent escape or entrance of undesirable EMI components.

The busbar is configured to be connected to the power converter units via the connecting elements to establish a low inductive electrical connection between the plurality of power converter units. The busbar may comprise a positive power rail and a negative power rail between which a capacitive layer may be provided. The busbar may e.g. be a copper busbar, but may also be made of e.g. aluminium or other conducting material.

The power converter units may for example be standalone off the shelf power converter units which may function as inverters, rectifiers or transformers. The same power converter unit may be used for different purposes depending on the circumstances. The power converter units may be identical units, but they may also have different configurations. The at least two power converter units may comprise at least two power converter units configured to function as inverters, and/or at least two power converter units configured to function as rectifiers. The power converter assembly may comprise more than two converter units, such as three, four, five or more power converter units.

According to one embodiment, the busbar housing is galvanically connected to said at least one converter housing. By galvanically connecting the busbar housing to the converter housing(s), it is possible to achieve improved EMC since the housings may thereby together function as a Faraday's cage shielding the power converter units and the busbar from the surroundings. The busbar housing and the converter housings, being galvanically connected, together forms a shield preventing electromagnetic interference.

According to one embodiment, the busbar housing is galvanically connected to said at least one converter housing by means of at least one metal-to-metal contact. A galvanic connection and an efficient shielding may thereby be ensured. The metal-to-metal contact is preferably provided between mutually facing surfaces of the converter housing(s) and the busbar housing, respectively. For example, an upper surface of the converter housing(s) may be in contact with a lower surface of the busbar housing. Alternatively, metallic connection members may be provided, which are in contact with both of the busbar housing and the converter housings. Such metallic connection members should preferably be configured to shield the connecting elements (connecting the busbar and the power converter units) by extending around the connecting elements.

According to one embodiment, each of the at least two connecting elements is galvanically isolated from the busbar housing and the at least one converter housing by means of an air gap provided between each of the connecting elements and the respective housing. The air gap may be of a size order of several millimetres depending on voltage level, wherein a higher voltage level requires a larger air gap. It provides an efficient galvanic isolation between the connecting elements on one hand and the housings on the other hand. The air gap should be sufficiently small so that the electromagnetic shielding properties of the housings are not compromised. The connecting elements are in this case preferably in the form of solid connection rods, such that the air gap is ensured also when the power converter assembly is subjected to vibrations. Instead of an air gap, electrically insulating material may be provided between the connecting elements and the housings.

According to one embodiment, the busbar housing comprises impermeable outer walls, i.e. walls that are impermeable to liquid, gas, dust, etc. Also the at least one converter housing may comprise impermeable outer walls. The impermeable outer walls form an efficient shield protecting the busbar and/or the converter units from e.g. dust, dirt, moisture, and chemicals. This is particularly beneficial in e.g. vehicles or working machines, in which the power converter assembly is more exposed to various pollutions than in a more protected environment, such as in a server hall. The housings may of course be provided in e.g. two or more parts, which are mounted together to form impermeable outer walls.

According to one embodiment, the power converter assembly comprises at least one electrical input and/or output terminal located outside of the busbar housing. The at least one electrical input and/or output terminal may comprise at least one connection for transmitting and/or receiving control signals. This enables power input/output directly to/from the individual power converter units.

According to one embodiment, at least one of the at least one electrical input and/or output terminal is configured to be connected to a power source, and/or at least one of the at least one electrical input and/or output terminal is configured to be connected to an electric machine. For example, each power converter unit may be provided with electrical input and output terminals for external connection to electric motors.

According to one embodiment, the connecting elements are solid connection rods, such as copper rods or other metallic rods. Using solid connection rods, it is possible to achieve a more well-defined inductance than using e.g. cables or wires.

The connecting elements may also be in the form of busbars comprising a positive and a negative power rail separated by an insulating layer, similarly to the above described busbar. In this case, it is sufficient to provide one connecting element per power converter unit, while as if solid connection rods are used, two connecting elements per power converter unit are needed (positive and negative, respectively).

According to one embodiment, the power converter assembly comprises at least two of said converter housings, wherein each one of said power converter units is enclosed and shielded in a respective one of said converter housings. Efficient shielding is thereby provided so that problems with electromagnetic interference between the power converter units may be minimized. Furthermore, by providing separate converter housings, one per power converter unit, a modular system may be provided, facilitating scaling of the power converter assembly.

According to one embodiment, said at least one converter housing comprises at least two compartments, each compartment enclosing and shielding one of said power converter units. For example, the converter housing may comprise five compartments, wherein one of said power converter units is provided in each compartment. A compact power converter assembly may thereby be provided. The compartments may be designed such that efficient electromagnetic shielding is achieved between the power converter units.

According to one embodiment, the power converter assembly further comprises a casing in which the at least one converter housing is contained. The power converter assembly is thereby easy to handle, and the casing also provides mechanical protection as well as further protection against various pollutions. The casing may be configured as a rack in which the converter housing(s) may be easily inserted and stacked.

According to a second aspect of the invention, at least the primary object is also achieved by a power system comprising at least one power source and the above described proposed power converter assembly connected to the at least one power source. The power source may be an AC power source, such as a generator connected to e.g. an internal combustion engine or similar, or a DC power source, including e.g. batteries, supercapacitors, and/or fuel cells. The power system may preferably comprise more than one power source connected to the power converter assembly, e.g. a generator and a battery pack. Various different electric systems and devices, such as an electric traction motor, a lighting system, an audio system, a hydraulic pump, or other auxiliary systems, may be connected to the power system and receive AC or DC power output therefrom.

The proposed power system may e.g. be an electric drive system for driving an electric motor, such as for driving a hydraulic pump, for propelling a machine, for driving a fan, or similar. The proposed power system may be a pure electric drive system, comprising only one or more electric power sources, or a hybrid drive system, comprising apart from at least one electric power source also an internal combustion engine and a generator.

The invention also relates to a working machine comprising the proposed power converter assembly and to a vehicle comprising the proposed power converter assembly. The working machine or vehicle may e.g. comprise a pure electric drive system or a hybrid drive system including the proposed power converter assembly.

Advantages and advantageous embodiments of such a working machine and vehicle appear from the above description of the power converter assembly.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

The drawings are schematic and are not necessarily drawn to scale.

DETAILED DESCRIPTION OF EXAMPLE EMBODIMENTS OF THE INVENTION

Figure 1:
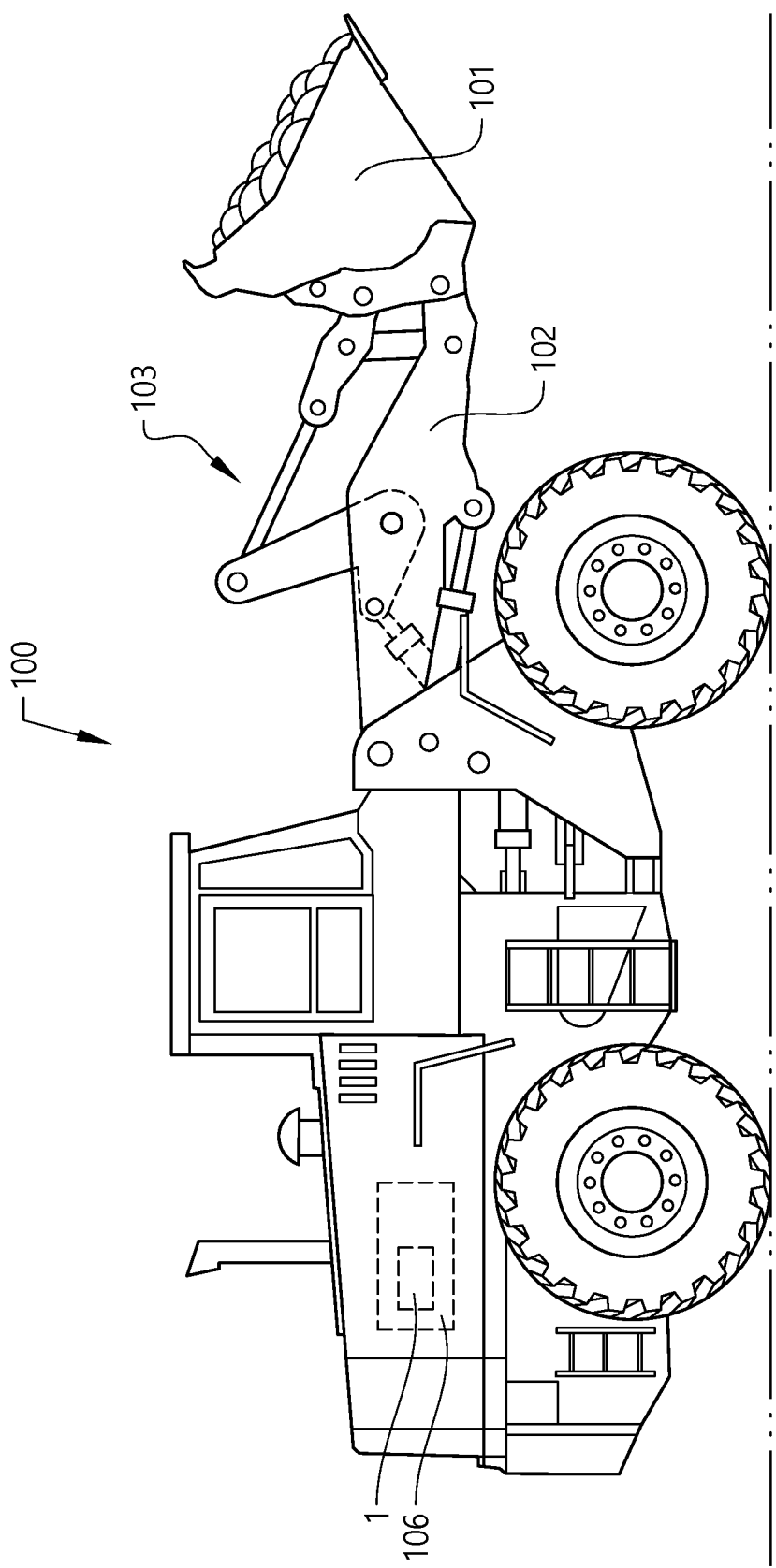
FIG. 1 schematically shows a working machine according to an embodiment of the invention, FIG. 2 schematically shows a power system according to an embodiment of the invention.
Figure 2:
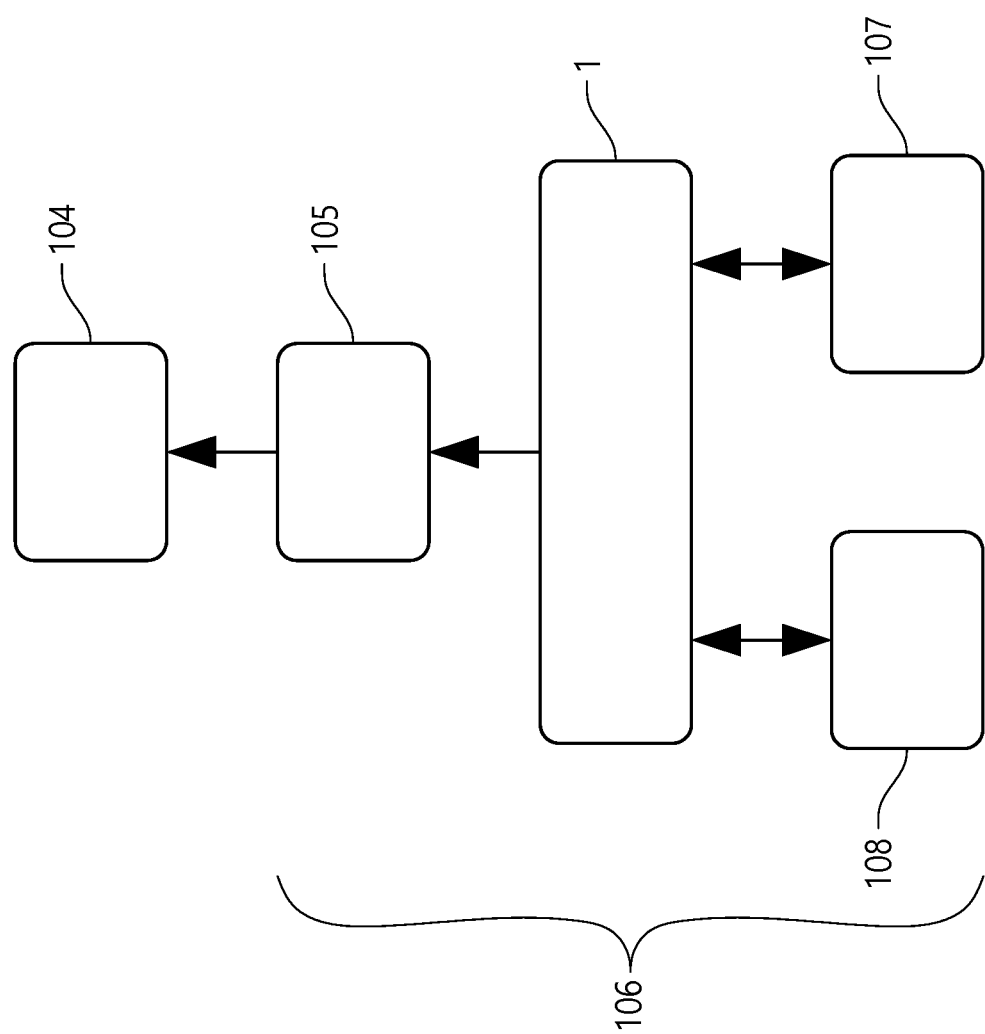

FIG. 1. is an illustration of a working machine 100 in the form of a wheel loader. The wheel loader is an example of a working machine in which a power system including a power converter assembly according to the invention can be applied. The wheel loader has a bucket 101 which is arranged on a load arm 102 for lifting and lowering the bucket 101. The wheel loader comprises a hydraulic system 103 for lifting, lowering and tilting the bucket 101, which hydraulic system 103 includes a hydraulic pump 104 driven by an electric machine 105 (not shown in FIG. 1), i.e. an electric motor. The electric motor 105 is powered by a power system 106, illustrated schematically in FIG. 2.

The power system 106 has an AC power source 107 in the form of a generator connected to an engine (not shown), a DC power source 108 in the form of a battery pack, and a power converter assembly 1 connected to the generator and the battery pack. The power converter assembly 1 is further connected to the electric motor 105, driving the hydraulic pump 104. During operation of the working machine 100, either the generator 107 or the battery pack 108, or both, provide(s) input power to the power converter assembly 1, which converts the input power into output power of a required voltage level and/or frequency needed to drive the electric motor 105. Of course, the shown power system 106 is greatly simplified to illustrate the working principle, and may in reality include many more components and more complex connections between the various components. Moreover, other types of AC and DC power sources may be used, such as a supercapacitor, and the electric motor 105 may be configured to drive other devices than a hydraulic pump, or it may be configured to propel, or assist in propelling of, the working machine.

Figure 3:
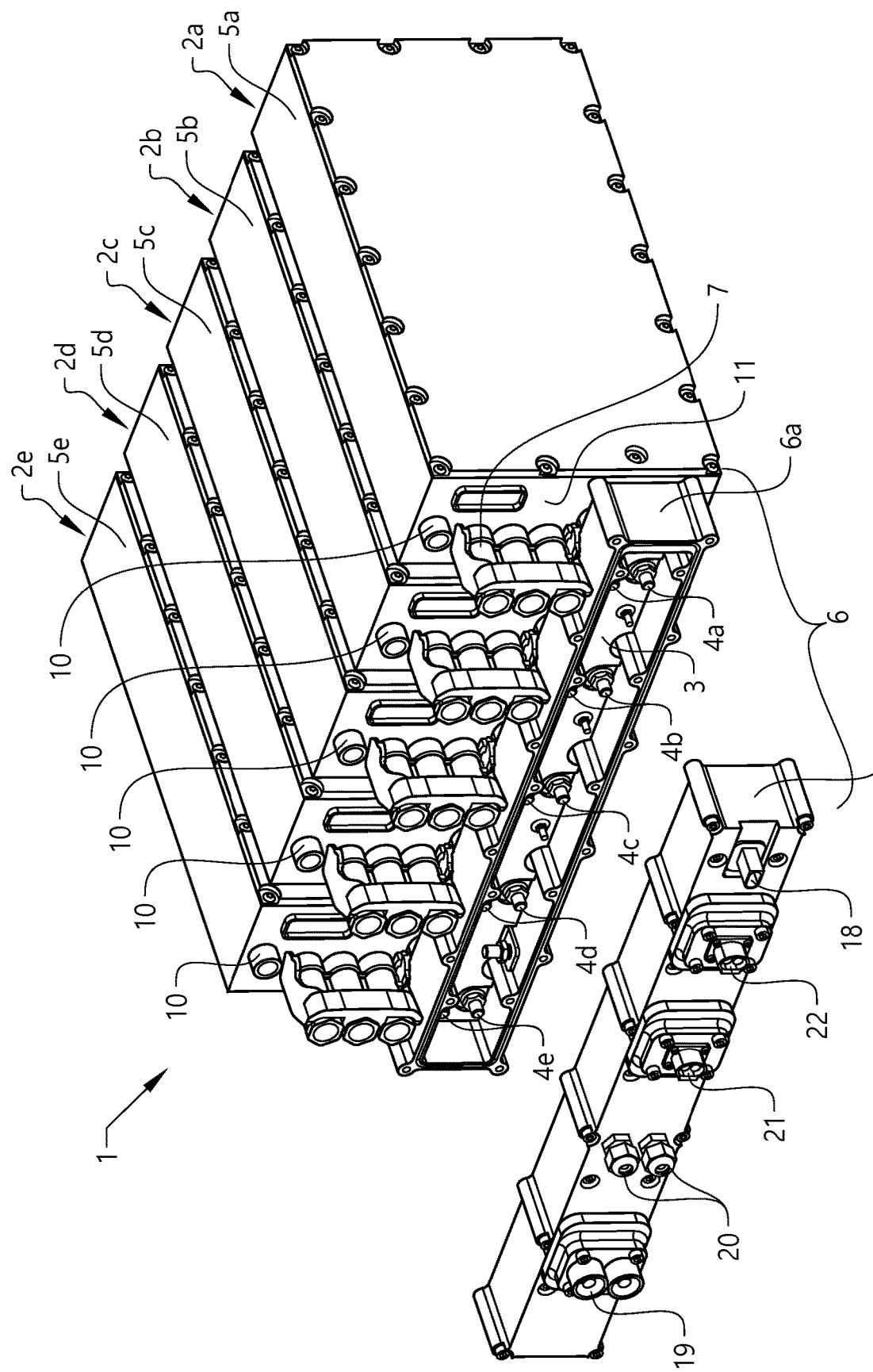
FIG. 3 is a perspective view of a power converter assembly according to an embodiment of the invention.

A power converter assembly 1 according to an embodiment of the invention is shown in greater detail in FIG. 3. The power converter assembly 1 includes five power converter units 2a-2e, a busbar 3 and connecting elements 4a-4e connecting the power converter units 2a-2e to the busbar 3 for conducting electric current between the power converter units 2a-2e and the busbar 3. The power converter assembly 1 further includes five converter housings 5a-5e, each converter housing enclosing a respective one of the power converter units 2a-2e, and a busbar housing 6 enclosing the busbar 3. The busbar housing 6 is herein formed from two parts 6a, 6b, which are joined together by fasteners such as screws. The two parts 6a, 6b are made of metal material, such that EMI shielding as well as protection against e.g. liquids and other pollutants is provided.

Figure 4:
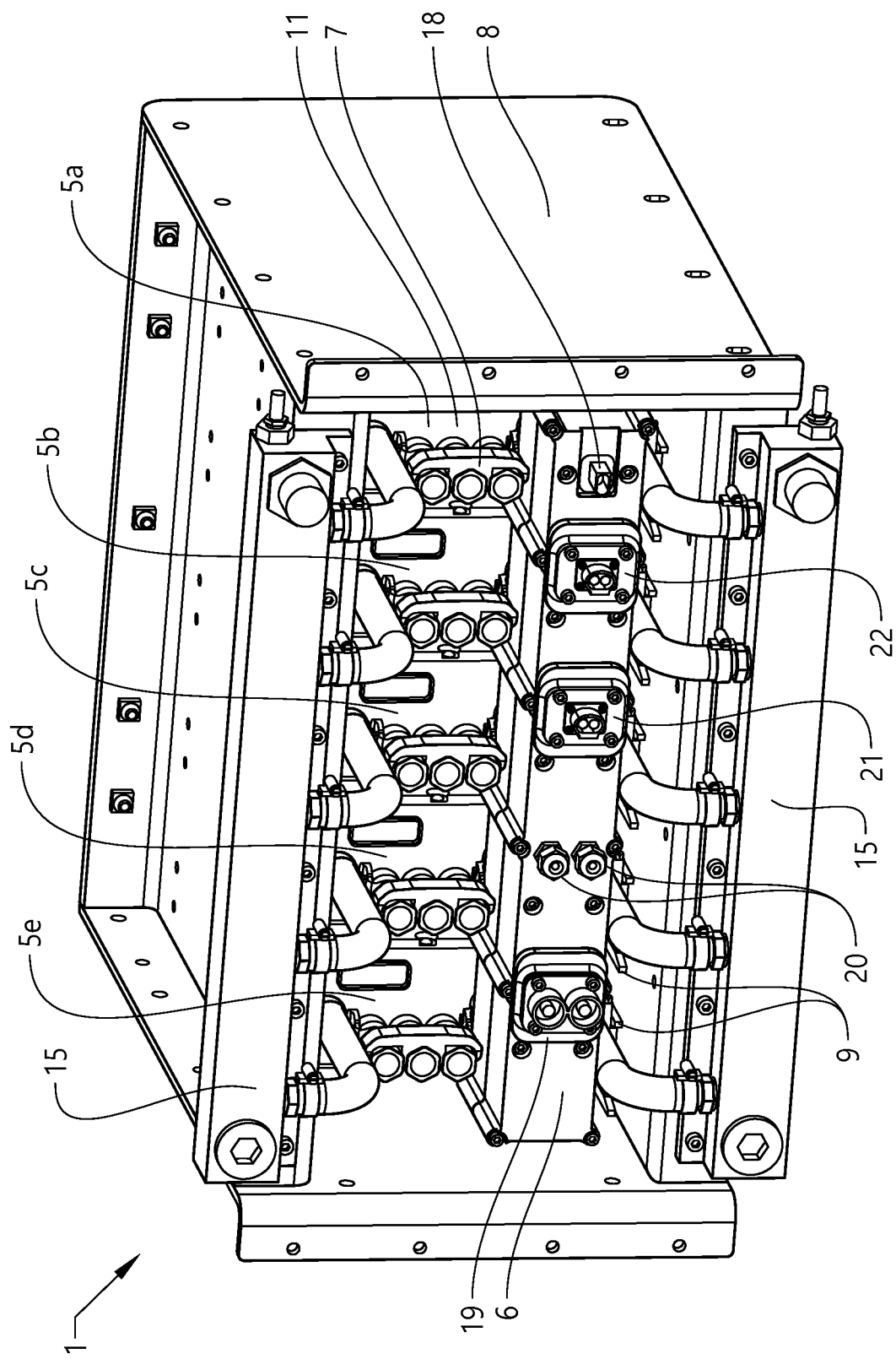
FIG. 4 is a perspective view of a power converter assembly according to an embodiment.

As shown in FIG. 4, the converter housings 5a-5e and the busbar housing 6 may be received in a casing 8, comprising racks 9 for holding the converter housings 5a-5e. The power converter assembly 1 is further connected to a cooling system 15 for circulation of coolant through the power converter units 2a-2e via cooling connections 10.

Figure 5:
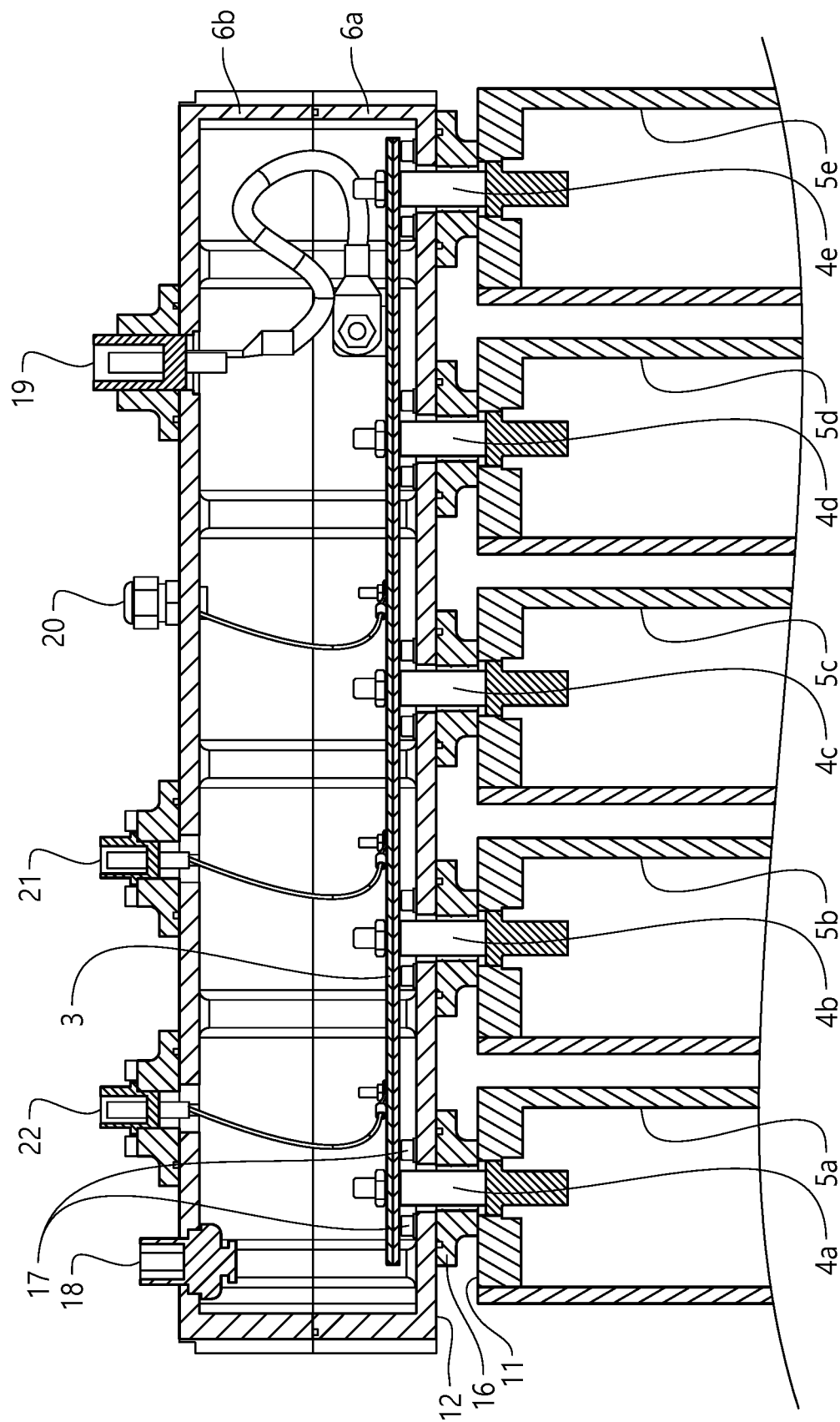
FIG. 5 is a sectional view of the power converter assembly in FIG. 3.
Figure 6:
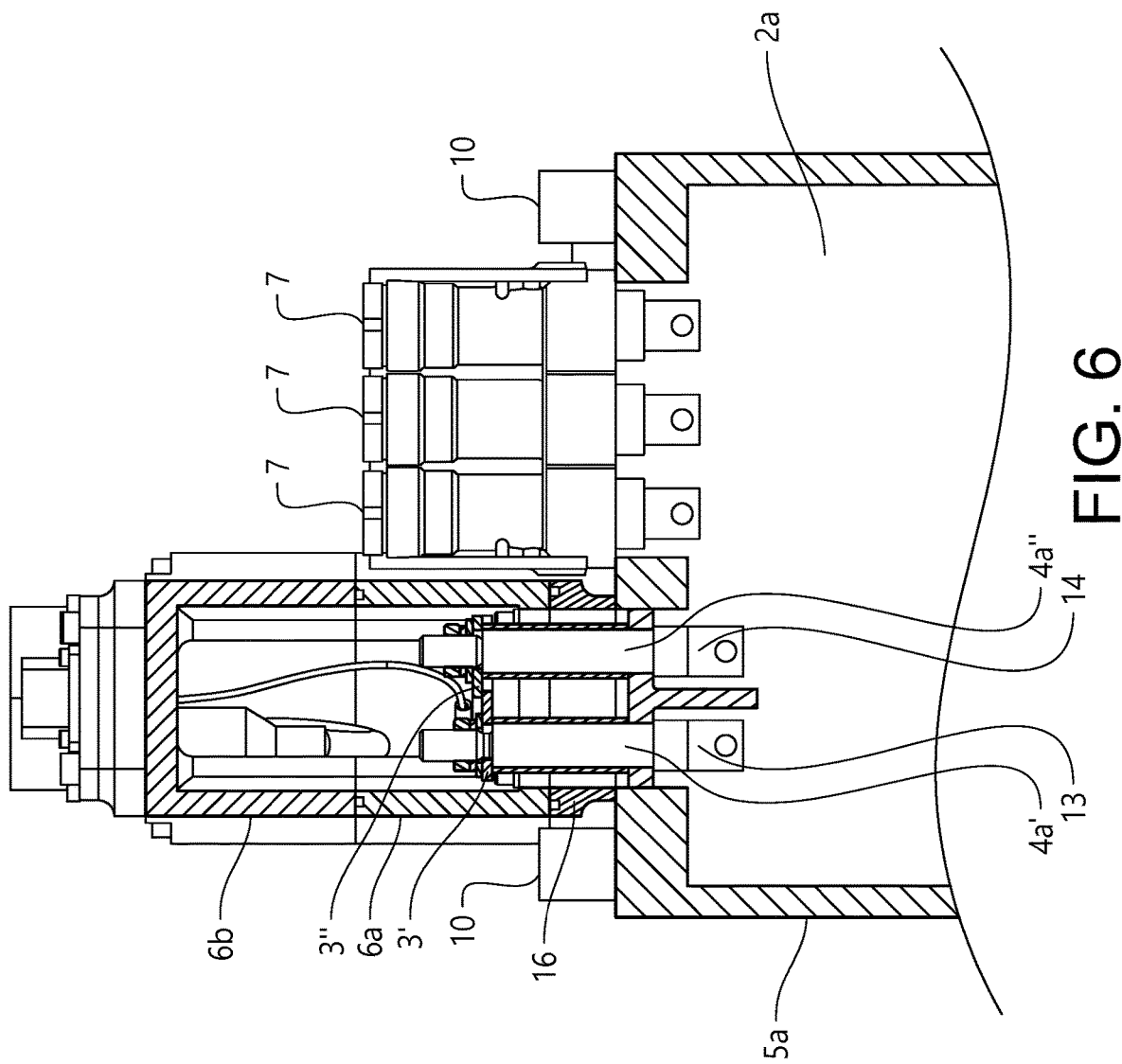
FIG. 6 is another sectional view of the power converter in FIG. 3.

In the shown embodiments, the converter housings 5a-5e and the connecting elements 4a-4e are identical, and only one of the converter housings 5a and a set of connecting elements 4a will therefore be described in detail. Reference is also made to FIGS. 5 and 6, in which the power converter assembly 1 is shown in schematic sectional views.

The converter housing 5a has a basic shape of a rectangular cuboid having an upper side 11 via which the power converter unit 2a may be connected to the busbar 3. In the shown embodiments, the converter housing 5a is formed from solid metal wall elements which have been joined together using fasteners, such as screws. The solid metal wall elements provide EMI shielding as well as protection against e.g. liquids and pollutants.

A galvanic connection between the converter housing 5a and the busbar housing 6 is provided by means of a metallic connection member 16 provided between the upper side 11 of the converter housing 5a and a lower side 12 of the busbar housing 6, the connection member 16 being in metal-to-metal contact with surfaces of the respective housings 5a, 6. Screws 17 are provided for joining the housings 5a, 6 and the connection member 16.

The busbar 3 has a negative power rail 3' and a positive power rail 3" which are together enclosed in the busbar housing 6. As can be seen in FIG. 6, the power converter unit 2a has a negative DC− connection 13 and a positive DC+ connection 14, wherein a first connecting element 4a' is used to connect the DC− connection 13 to the negative power rail 3' and wherein a second connecting element 4a" is used to connect the DC+ connection to the positive power rail 3". The connecting elements 4a', 4a" are in the form of metal rods. A small air gap is provided between on one hand each of the connecting elements 4a', 4a" and on the other hand the housings 5a, 6 and the connection member 16, providing galvanic isolation. The connection member 16, apart from providing a galvanic connection between the housings 5a, 6, serves to shield the connecting elements 4a', 4a" and thereby improve the electromagnetic compatibility (EMC) of the power converter assembly 1.

The power converter unit 2a further comprises an electrical input and output terminal 7 for connecting the power converter unit to e.g. a power source or an electric machine, such as a three-phase electric motor. Thus, in the shown embodiment, five three-phase electric motors may be connected to a respective one of the power converter units 2a-2e. A connection may further be provided for transmitting and/or receiving control signals.

A filtered signal connection 18 for providing an interlock loop may be provided inside the busbar housing 6. Furthermore, in the shown embodiment, a shielded connection 19 is provided for connecting the busbar 3 to a DC power source such as a battery. Shielded connections 20, 21, 22, such as 600 V connections, are also provided for connection of e.g. auxiliary loads to the busbar 3.

The power converter unis 2a-2e are only schematically shown in the drawings, but it is to be understood that these may or may not be identical, and that they include various electronic components such as one or more transistors, e.g. insulated-gate bipolar transistors (IGBTs), thyristors, power diodes, and/or metal oxide semiconductor field effect transistors (MOSFETs), and one or more capacitors.

It is to be understood that the present invention is not limited to the embodiments described above and illustrated in the drawings; rather, the skilled person will recognize that many changes and modifications may be made within the scope of the appended claims.

The invention claimed is:

1. A power converter assembly comprising:
at least two power converter units;
a busbar;
at least two connecting elements, each connecting element galvanically connecting one of said power converter units to the busbar, thereby interconnecting the at least two power converter units; and
at least one converter housing, wherein the at least one converter housing encloses and shields at least one of said power converter units;
wherein
the power converter assembly further comprises a busbar housing in which the busbar is contained and shielded, wherein the at least two connecting elements are galvanically isolated from the busbar housing and from the at least one converter housing.

2. The power converter assembly according to claim 1, wherein the busbar housing is galvanically connected to said at least one converter housing.

3. The power converter assembly according to claim 2, wherein the busbar housing is galvanically connected to said at least one converter housing by means of at least one metal-to-metal contact.

4. The power converter assembly according to claim 1, wherein each connecting element of the at least two connecting elements is galvanically isolated from the busbar housing and the at least one converter housing by means of an air gap provided between each of the connecting elements and the respective housing.

5. The power converter assembly according to claim 1, wherein the busbar housing and/or the at least one converter housing comprises impermeable outer walls.

6. The power converter assembly according to claim 1, wherein the power converter assembly comprises at least one electrical input and/or output terminal located outside of the busbar housing.

7. The power converter assembly according to claim 6, wherein at least one of the at least one electrical input and/or output terminal is configured to be connected to a power source, and/or wherein at least one of the at least one electrical input and/or output terminal is configured to be connected to an electric machine.

8. The power converter assembly according to claim 1, wherein the connecting elements are solid connection rods.

9. The power converter assembly according to claim 1, comprising at least two of said converter housings, wherein each one of said power converter units is enclosed and shielded in a respective one of said converter housings.

10. The power converter assembly according to claim 1, wherein said at least one converter housing comprises at least two compartments, each compartment enclosing and shielding one of said power converter units.

11. The power converter assembly according to claim 1, further comprising a casing in which the at least one converter housing is contained.

12. A power system comprising at least one power source and the power converter assembly according to claim 1 connected to the at least one power source.

13. The power system according to claim 12, wherein the power system is an electric drive system for driving an electric motor.

14. A working machine comprising the power converter assembly according to claim 1.

15. A vehicle comprising the power converter assembly according to claim 1.

\* \* \* \* \*